(12) United States Patent
Shi et al.

(10) Patent No.: US 9,971,105 B2
(45) Date of Patent: May 15, 2018

(54) FLEXIBLE PRINTED CIRCUIT BOARD AND OPTICAL NETWORK ALLOCATION DEVICE COMPRISING SAME

(71) Applicant: ZTE Corporation, Shenzhen, Guangdong (CN)

(72) Inventors: Yunlong Shi, Shenzhen (CN); Haowen Zhang, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 0 days. days.

(21) Appl. No.: 15/511,375

(22) PCT Filed: Mar. 19, 2015

(86) PCT No.: PCT/CN2015/074643
§ 371 (c)(1),
(2) Date: Mar. 15, 2017

(87) PCT Pub. No.: WO2015/154616
PCT Pub. Date: Oct. 15, 2015

(65) Prior Publication Data
US 2017/0307832 A1    Oct. 26, 2017

(30) Foreign Application Priority Data

Sep. 17, 2014 (CN) .................... 2014 2 0536262 U

(51) Int. Cl.
*H04B 10/00* (2013.01)
*G02B 6/38* (2006.01)
(Continued)

(52) U.S. Cl.
CPC ......... *G02B 6/3895* (2013.01); *G02B 6/3897* (2013.01); *G02B 6/4281* (2013.01);
(Continued)

(58) Field of Classification Search
USPC ...................................... 398/9–20
See application file for complete search history.

(56) References Cited

U.S. PATENT DOCUMENTS

| 8,095,002 B2 | 1/2012 | Miguel | |
|---|---|---|---|
| 2009/0166404 A1* | 7/2009 | German | G02B 6/3895 235/375 |

(Continued)

FOREIGN PATENT DOCUMENTS

| CN | 102340420 A | 2/2012 |
|---|---|---|
| CN | 202872787 U | 4/2013 |

(Continued)

OTHER PUBLICATIONS

International Search Report in international application No. PCT/CN2015/074643, dated May 29, 2015, 3 pgs.

(Continued)

*Primary Examiner* — Agustin Bello
(74) *Attorney, Agent, or Firm* — Cooper Legal Group, LLC

(57) ABSTRACT

A flexible printed circuit board and optical network allocation device comprising same. The flexible printed circuit board comprises a circuit board body (1), a plurality of protruding interfaces (101) on the circuit board body, an adhesive layer (2) covering the upper surface of the circuit board body (1), components (102), and an uplink interface (103) used for information interaction with the components (102) on the circuit board body (1). Each protruding interface (101) is provided with an electronic label read/write interface (1011) used for reading electronic label information on an optical fiber head and an indicator (1012). The adhesive layer (2) is provided with an open window region (201) in the middle. The components (102) are immobilized on the upper surface of the circuit board body (1) and located in the open window region (201) of the adhesive layer, and (Continued)

are connected to the electronic label read/write interface (1011), the indicator (1012), and the uplink interface (103) respectively, used for controlling and monitoring the read/write information of the electronic label read/write interface (1011) and controlling on/off of the indicator (1012).

18 Claims, 1 Drawing Sheet

(51) Int. Cl.
    *G02B 6/42*     (2006.01)
    *G06K 7/10*     (2006.01)
    *H04B 10/2575*     (2013.01)

(52) U.S. Cl.
    CPC ....... *G02B 6/4292* (2013.01); *G06K 7/10366* (2013.01); *H04B 10/25753* (2013.01)

(56) References Cited

U.S. PATENT DOCUMENTS

| | | | | |
|---|---|---|---|---|
| 2010/0098425 A1* | 4/2010 | Kewitsch | ............ | G02B 6/3895 398/116 |
| 2010/0210135 A1* | 8/2010 | German | ............ | H04Q 1/138 439/491 |
| 2011/0221601 A1* | 9/2011 | Aguren | ............ | G02B 6/3895 340/653 |
| 2011/0274437 A1* | 11/2011 | Jones | ............ | G02B 6/3879 398/141 |
| 2012/0000977 A1 | 1/2012 | German | | |
| 2012/0168521 A1* | 7/2012 | Jones | ............ | G02B 6/3879 235/492 |
| 2013/0205579 A1* | 8/2013 | Mather | ............ | H04Q 1/138 29/593 |
| 2013/0207782 A1 | 8/2013 | Mather et al. | | |
| 2013/0260602 A1 | 10/2013 | German et al. | | |
| 2013/0306723 A1 | 11/2013 | Mather et al. | | |
| 2014/0138431 A1* | 5/2014 | Standish | ............ | G06K 7/10415 235/375 |
| 2014/0139320 A1 | 5/2014 | Standish et al. | | |
| 2014/0141649 A1* | 5/2014 | Standish | ............ | G06K 7/10415 439/620.01 |
| 2015/0222352 A1* | 8/2015 | Kewitsch | ............ | G02B 6/3895 235/375 |
| 2017/0307832 A1* | 10/2017 | Shi | ............ | G02B 6/3895 |

FOREIGN PATENT DOCUMENTS

| | | |
|---|---|---|
| CN | 202995107 U | 6/2013 |
| CN | 202995767 U | 6/2013 |
| CN | 203038302 U | 7/2013 |
| CN | 103454736 A | 12/2013 |
| CN | 103809252 A | 5/2014 |
| CN | 204129294 U | 1/2015 |
| WO | 2007138694 A1 | 12/2007 |
| WO | 2011130995 A1 | 10/2011 |

OTHER PUBLICATIONS

English Translation of the Written Opinion of the International Search Authority in international application No. PCT/CN2015/074643, dated May 29, 2015, 6 pgs.

Supplementary European Search Report in European application No. 15776456.4, dated Sep. 18, 2017, 8 pgs.

* cited by examiner

FLEXIBLE PRINTED CIRCUIT BOARD AND OPTICAL NETWORK ALLOCATION DEVICE COMPRISING SAME

TECHNICAL FIELD

The present disclosure generally relates to optical fiber network distribution techniques, and more particularly to an optical fiber network distribution device.

BACKGROUND

Compared with a conventional passive optical fiber distribution network, an intelligent optical fiber distribution network further implements a function of intelligent optical fiber plug detection, which facilitates managing, identifying, maintaining optical fiber resources. Implementation of the intelligent optical fiber distribution network includes two aspects, i.e., new network construction and old network reconstruction. The new network construction is generally easy. During the new network construction, an overall intelligent optical fiber network device architecture may be designed newly, and an optical fiber connector and an optical fiber adapter may be designed into proper forms. However, it is difficult to reconstruct the conventional passive optical fiber distribution network into the intelligent optical fiber distribution network, since it is required that related network services cannot be interrupted during the reconstruction, which means that a rack, a fiber splice tray and an optical fiber adapter cannot be altered.

A related solution is to replace an upper cover of an optical fiber fusing and wiring panel in the original system with a customized intelligent cover. The intelligent cover includes an upper cover member and an printed circuit board (PCB) which are specially customized. The customized upper cover member is made of plastic materials, and needs mould-opening, resulting in a high cost. The PCB needs to be customized based on the profile of the upper cover member so as to implement the function of the intelligent optical fiber plug detection. Since the structures of the upper cover member and the PCB of the fusing and wiring panel are limited by a conventional fusing and wiring panel housing, different upper covers and PCBs have to be manufactured for housings of the fusing and wiring panels of different types. These intelligent covers differ from each other only in their respective structures, but have no changes in the principles of hardware and software. Therefore, repetitive development for housings of different types may cause a huge waste in human and material resources.

In a related reconstruction method, the PCB and the upper cover are assembled together. Only one surface of the PCB is protected by the upper cover, and the other surface of the PCB is exposed. Therefore, protection of components in the exposed surface of the PCB needs to be strengthened during transportation. Thereby, the overall weight of the assembly is increased, causing the cost of package material and transportation to increase. Furthermore, during in-field installation, the components in the PCB are vulnerable to mechanical crash damages and electrostatic damages, which may destroy the PCB and lead to a higher failure rate, causing the reconstruction cost to increase. Furthermore, the conventional optical fiber distribution network system is passive and has no power consumption. In view of this, power consumption of the system should be reduced as much as possible during the intelligentialization reconstruction, and thus most of related intelligentialization reconstruction solutions have a very low power consumption.

Since the intelligent optical distribution network (ODN) system has a very low power consumption and produces little heat, when the ambient temperature is changed, condensation may be generated on the PCB easily. Long-time condensation may cause corrosion and short circuit between pins of components in the PCB or even disable the components. This situation occurs especially in the case that, in an outdoor optical wiring system, most of devices are not working normally and are powered on only when management is needed. In a poor outdoor weather condition, condensation on the PCB, component corrosion caused by water penetration and single board failure may occur frequently.

Therefore, it may be desired to provide an intelligentialization reconstruction solution for an optical fiber distribution network, which can be suitable for bodies of fusing and wiring panels of most types and make the best to remain the original covers of the fusing and wiring panels unchanged.

SUMMARY

In order to solve the problems of the above-described related solutions, the technical solutions of the present disclosure provide an optical fiber network distribution apparatus. Components in the apparatus may be protected from mechanical crash damages, electrostatic damages and component corrosion caused by condensation.

In order to solve the problems, the disclosure provides the following technical solutions.

A flexible printed circuit board, including:

a circuit board body;

a plurality of protruding interfaces arranged on the circuit board body, wherein the protruding interfaces include an electronic tag read/write interface for reading electronic tag information on a head of an optical fiber, and an indication light;

an adhesive layer, covering an upper surface of the circuit board body and is provided with an open window region in middle of the adhesive layer;

components, arranged to monitor reading/writing information of the electronic tag read/write interface and control on/off of the indication light, wherein the components are fixed on the upper surface of the circuit board body and located in the open window region of the adhesive layer; and an uplink interface, located on the circuit board body and arranged to perform information interaction with the components; wherein, the components are connected to the electronic tag read/write interface, the indication light and the uplink interface.

According to an embodiment, an optical fiber adapter has a deflection angle of 45° to 90° with respect to a front mounting plate of a fusing and wiring panel housing.

According to an embodiment, the protruding interface has a deflection angle of 45° to 90° with respect to the circuit board body.

According to an embodiment, the electronic tag read/write interface is a contact interface or a contactless interface.

According to an embodiment, the contact interface is a contact point or a connector.

According to an embodiment, the contactless interface is a Radio Frequency Identification (RFID) antenna.

According to an embodiment, the circuit board body is made of a material of polyimide, polyester film or polytetrafluoroethylene.

According to an embodiment, the circuit board body have a rectangular shape.

According to an embodiment, the uplink interface is a Flexible Printed Circuit (FPC) interface, a Registered Jack 45 (RJ45) interface, an Universal Serial Bus (USB) interface, a DB9 interface or a radio-frequency antenna interface.

An optical fiber network distribution apparatus including the flexible printed circuit board according to any one of the flexible printed circuit boards, where the apparatus further includes:

a fusing and wiring panel housing, fixed under the flexible printed circuit board and including an optical fiber adapter for connecting optical fiber; and a fusing and wiring panel upper cover covering the flexible printed circuit board, wherein an lower surface of the fusing and wiring panel upper cover is connected to the adhesive layer of the flexible printed circuit board, so as to package the components of the flexible printed circuit board within a space enclosed by the fusing and wiring panel upper cover, the adhesive layer and the circuit board body of the flexible printed circuit board.

The beneficial effects of the technical solution of the disclosure are as follows.

Compared to related intelligent fusing and wiring panel reconstruction solutions, the technical solution of the disclosure employs a construction method of a flexible printed circuit board (PCB). The flexible PCB is flexible, very thin and has certain plasticity. With this PCB, many types of conventional optical fiber fusing and wiring panels may be reconstructed into an intelligent optical fiber fusing and wiring panels. Therefore, the problem that different upper covers of the intelligent optical fiber fusing and wiring panels have to be designed for different types of fusing and wiring panel bodies to be reconstructed can be solved. Furthermore, the circuit board body has a small thickness and a light weight, and is equipped with a protective film, thereby dramatically reducing the cost of package and transportation. The components on the flexible PCB according to the technical solution of the disclosure are finally packaged within a space enclosed by the fusing and wiring panel upper cover, the adhesive layer and the flexible PCB. The antistatic performance may be substantially increased. Due to the sealing effect of the adhesive layer, the components on the flexible PCB will not be affected by ambient humidity and thus may have an improved environment adaptability, which greatly prolongs life spans of the circuit of the intelligent fusing and wiring panel.

In the appended drawings, the following reference numbers may be used.

1: a circuit board body; 101: protruding interface; 1011: electronic tag read/write interface; 1012: indication light; 102: component; 103: uplink interface; 2: adhesive layer; 201: open window region; 3: protective film; 4: fusing and wiring panel housing; 401: optical fiber adapter; 5: fusing and wiring panel upper cover.

DETAILED DESCRIPTION

Exemplary embodiments of the disclosure will be described in detail in conjunction with the appended drawings. It should be understood that, although the appended drawings show the exemplary embodiments of the disclosure, the disclosure may be implemented in various was and is not limited to the embodiments herein. The embodiments are provided in order to make the skilled in the art understand the disclosure more thoroughly and appreciate the protection scope of the disclosure completely.

Figure 1:
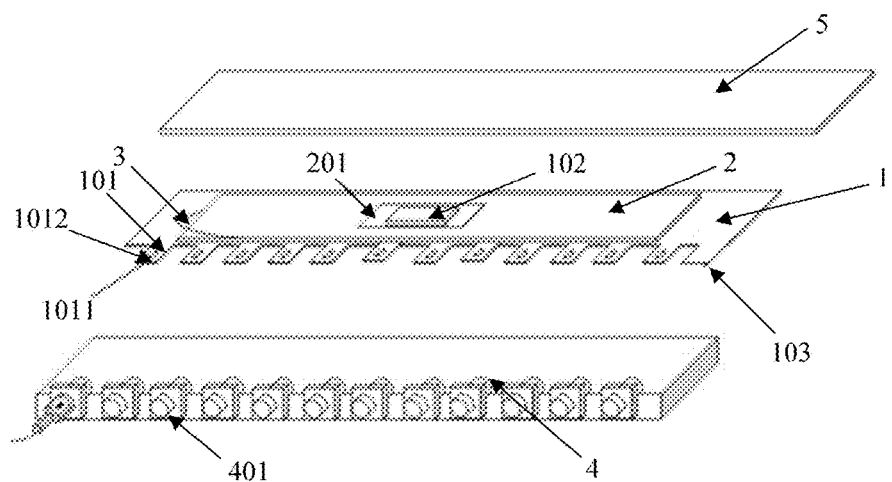
FIG. 1 is a schematic diagram of an optical fiber network distribution apparatus according to an embodiment of the disclosure.

FIG. 1 is a schematic diagram of an optical fiber network distribution apparatus according to an embodiment of the disclosure. The optical fiber network distribution apparatus includes a flexible printed circuit board, a fusing and wiring panel housing 4, a fusing and wiring panel upper cover 5.

The flexible printed circuit board includes a circuit board body 1, multiple protruding interfaces 101, an adhesive layer 2, components 102, and an uplink interface 103.

The protruding interfaces 101 are arranged on the circuit board body 1. The protruding interfaces 101 include an electronic tag read/write interface 1011 for reading electronic tag information on a head of an optical fiber, and an indication light 1012.

The adhesive layer 2 covers an upper surface of the circuit board body 1 and is provided with an open window region 201 in middle of the adhesive layer 2.

The components 102 are arranged to control reading/writing information of the electronic tag read/write interface 1011 and control on/off of the indication light 1012. The components 102 are fixed on the upper surface of the circuit board body 1 and located in the open window region 201 of the adhesive layer 2.

The uplink interface 103 is located on the circuit board body 1 and arranged to perform information interaction with the components 102. The components 102 are connected to the electronic tag read/write interface 1011, the indication light 1012 and the uplink interface 103.

The fusing and wiring panel housing 4 is fixed under the flexible printed circuit board and includes an optical fiber adapter 401 for connecting optical fiber.

The fusing and wiring panel upper cover 5 covers the flexible printed circuit board. A lower surface of the fusing and wiring panel upper cover 5 is connected to the adhesive layer 2, so as to package the components 102 within a space enclosed by the fusing and wiring panel upper cover 5, the adhesive layer 2 and the circuit board body 1.

According to the embodiment of the disclosure, the flexible printed circuit board is employed. The circuit board body 1 is flexible, very thin and has certain plasticity. With this flexible printed circuit board, many types of conventional optical fiber fusing and wiring panels may be reconstructed into an intelligent optical fiber fusing and wiring panels. Therefore, the problem that different upper covers of the intelligent optical fiber fusing and wiring panels have to be designed for different types of fusing and wiring panel bodies to be reconstructed can be solved. The protruding interfaces 101 are further provided on the circuit board body 1 for reading/writing electronic tag information on the head of the optical fiber. The uplink interface 103 is further arranged to perform information interaction between the fusing and wiring panel and the components 102. That is, the uplink interface 103 uploads the electronic tag information from the intelligent fusing and wiring panel to the components 102, and downloads control commands from the components 102 to the intelligent fusing and wiring panel.

Furthermore, the circuit board body 1 may be made of a material of polyimide, polyester film, polytetrafluoroethylene or other polymer materials with a good overall performance. Therefore, the circuit board body 1 may have a high reliability and may be a printed circuit board with a good flexibility. In additional, the circuit board has a high wiring density, a light weight and a low thickness. It should be understood that, the material of the circuit board body 1 is not limited to those disclosed in the embodiment.

According to the embodiment of the disclosure, optionally, before installation, the adhesive layer 2 is covered with a protective film 3 in order to protect the adhesive layer 2 and the components 102 on the flexible circuit board. The components 102 on the circuit board body 1 are finally packaged within a space enclosed by the fusing and wiring panel upper cover 5, the adhesive layer 2 and the circuit board body 1, so as to obtain a greatly improved antistatic performance. Due to the sealing effect of the adhesive layer 2, the components 102 on the circuit board body 1 may be protected from the corrosion caused by condensation generated by ambient humidity, which greatly prolongs life spans of the circuit of the intelligent fusing and wiring panel.

Figure 2:
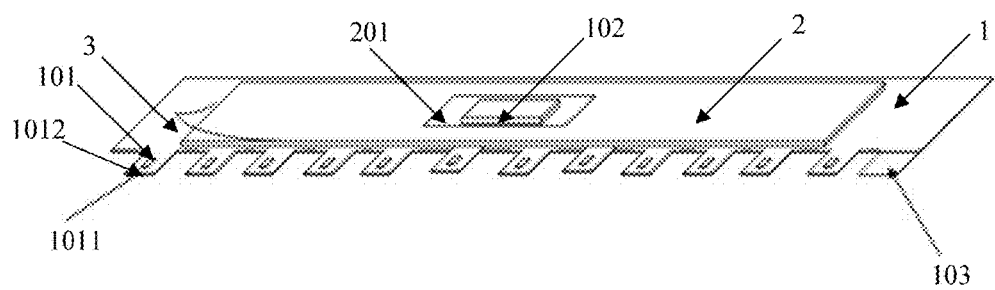
FIG. 2 is a schematic diagram of a flexible printed circuit board according to an embodiment of the disclosure.

As shown in FIG. 2, according to the embodiment of the disclosure, the circuit board body 1 has a rectangular shape. However, in practice, the circuit board body 1 may have another shape. The profile of the circuit board body 1 may be changed depending on the fusing and wiring panel housings 4 of different types. For example, the circuit board body 1 may have other irregular shapes adapted to the fusing and wiring panel housings 4 of different types, so as to avoid a huge waste in human and material resources.

According to the embodiment, in order to protect eyes of an operator from being hurt by a laser light conducted by an optical fiber, the optical fiber adapter 401 is arranged to have a certain deflection angle with respect to a front mounting plate of the fusing and wiring panel housing 4 rather than to be perpendicular to the front mounting plate. The optical fiber adapter 401 may have a deflection angle of 45° to 90° with respect to the front mounting plate of the fusing and wiring panel housing 4. Since chassis of the fusing and wiring panels may be from different manufacturers, of different types or of different bands, the optical fiber adapters 401 in the chassis may be clamped square SCs, clamped circular STs, threaded circular FCs, clamped square LCs slightly smaller than the SCs and the like, depending on the chassis. In order to fit different types and brands of the optical fiber adapters 401 with different deflection angles, the disclosure employs the flexible printed circuit board with a certain flexibility. The protruding interfaces 101 may have a certain deflection angle with respect to the circuit board body 1. The deflection angle of the protruding interfaces 101 with respect to the circuit board body 1 is fit to the deflection angle of the optical fiber adapter 401. The deflection angle of the protruding interface 101 is 45° to 90° and is not influenced by the deflection angle of the optical fiber adapter 401 of the fusing and wiring panel to be reconstructed.

According to the embodiment of the disclosure, optionally, the protruding interfaces 101 may include an electronic tag read/write interface 1011 and the uplink interface 103. The electronic tag read/write interface 1011 may be a contact interface or a contactless interface. Depending on the electronic tag read/write interface 1011, connection between the electronic tag read/write interface 1011 and an electronic tag on the optical fiber adapter 401 may be a wire contact connection or a wireless contactless connection. The contact interface is usually a contact point or a connector, and the contactless interface is usually a Radio Frequency Identification (RFID) antenna. The communication modes of the electronic tag are not limited to a contact tag 1-Wire, an Inter-Integrated Circuit (I2C), a Serial Peripheral Interface (SPI), or a contactless tag RFID, and is widely applicable.

The uplink interface 103 is adapted to perform interaction about information in the electronic tag and the control commands in the components of the optical fiber network distribution apparatus. That is, the uplink interface 103 uploads port information from the intelligent fusing and wiring panel to the components 102, and download control commands from the components 102 to the intelligent fusing and wiring panel, for example, to control on/off of the port indication light 1012. The uplink interface 103 may be a Flexible Printed Circuit (FPC) interface, a Registered Jack 45 (RJ45) interface, an Universal Serial Bus (USB) interface, a DB9 interface or other pin and socket interfaces, or may be a radio-frequency antenna interface or other forms. It should be understood that, a specific structure of the uplink interface 103 according to the embodiment may be selected as required and is widely applicable. The uplink interface 103 may further be connected to other single boards of the optical fiber network distribution apparatus, and may communicate with the single boards through transmission protocols such as RS485, RS232, SPI, I2C, USB, Bluetooth or the like.

Optionally, during installation, firstly, the flexible printed circuit board is placed to make the adhesive layer 2 face upward. The protective film 3 is removed so as to bond the flexible printed circuit board to the fusing and wiring panel upper cover 5 firmly. It should be noted that, the sealing of the adhesive layer around the components 102 causes the components 102 to be protected by the fusing and wiring panel upper cover 5, the adhesive layer 2 and the flexible printed circuit board. Then, the fusing and wiring panel upper cover 5 mounted with the flexible circuit board is mounted into the fusing and wiring panel housing 4. At last, the protruding interfaces 101 of the flexible circuit board are connected to the corresponding electronic tag or brought into contact with the electronic tag.

The embodiments are preferred embodiments of the disclosure. It should be noted that, several modifications and variations which may fall within the protection scope of the disclosure, may be made by the skilled in the art, without departing from the principle of the discourse.

INDUSTRIAL APPLICABILITY

Compared to related intelligent fusing and wiring panel reconstruction solutions, the technical solution of the disclosure employs a construction method of a flexible printed circuit board (PCB). The flexible PCB is flexible, very thin and has certain plasticity. With this PCB, many types of conventional optical fiber fusing and wiring panels may be reconstructed into an intelligent optical fiber fusing and wiring panels. Therefore, the problem that different upper covers of the intelligent optical fiber fusing and wiring panels have to be designed for different types of fusing and wiring panel bodies to be reconstructed can be solved. Furthermore, the circuit board body has a small thickness and a light weight, and is equipped with a protective film, thereby dramatically reducing the cost of package and transportation. The components on the flexible PCB according to the technical solution of the disclosure are finally packaged within a space enclosed by the fusing and wiring panel upper cover, the adhesive layer and the flexible PCB. The antistatic performance may be substantially increased. Due to the sealing effect of the adhesive layer, the components on the flexible PCB will not be affected by ambient humidity and thus may have an improved environment adaptability, which greatly prolongs life spans of the circuit of the intelligent fusing and wiring panel. Therefore, the disclosure has a high industrial applicability.

What is claimed is:

1. A flexible printed circuit board, comprising:
a circuit board body;
a plurality of protruding interfaces arranged on the circuit board body, wherein the protruding interfaces comprise an electronic tag read/write interface for reading electronic tag information on a head of an optical fiber, and an indication light;
an adhesive layer, covering an upper surface of the circuit board body and is provided with an open window region in middle of the adhesive layer;
components, arranged to monitor reading/writing information of the electronic tag read/write interface and control on/off of the indication light, wherein the components are fixed on the upper surface of the circuit board body and located in the open window region of the adhesive layer; and
an uplink interface, located on the circuit board body and arranged to perform information interaction with the components; wherein, the components are connected to the electronic tag read/write interface, the indication light and the uplink interface.

2. The flexible printed circuit board according to claim 1, wherein an optical fiber adapter has a deflection angle of 45° to 90° with respect to a front mounting plate of a fusing and wiring panel housing.

3. The flexible printed circuit board according to claim 1, wherein the protruding interface has a deflection angle of 45° to 90° with respect to the circuit board body.

4. The flexible printed circuit board according to claim 1, wherein the electronic tag read/write interface is a contact interface or a contactless interface.

5. The flexible printed circuit board according to claim 4, wherein the contact interface is a contact point or a connector.

6. The flexible printed circuit board according to claim 4, wherein the contactless interface is a Radio Frequency Identification (RFID) antenna.

7. The flexible printed circuit board according to claim 1, wherein the circuit board body is made of a material of polyimide, polyester film or polytetrafluoroethylene.

8. The flexible printed circuit board according to claim 1, wherein the circuit board body have a rectangular shape.

9. The flexible printed circuit board according to claim 1, wherein the uplink interface is a Flexible Printed Circuit (FPC) interface, a Registered Jack 45 (RJ45) interface, an Universal Serial Bus (USB) interface, a DB9 interface or a radio-frequency antenna interface.

10. An optical fiber network distribution apparatus comprising a flexible printed circuit board,
wherein the flexible printed circuit board comprises:
a circuit board body;
a plurality of protruding interfaces arranged on the circuit board body, wherein the protruding interfaces comprise an electronic tag read/write interface for reading electronic tag information on a head of an optical fiber, and an indication light;
an adhesive layer, covering an upper surface of the circuit board body and is provided with an open window region in middle of the adhesive layer;
components, arranged to monitor reading/writing information of the electronic tag read/write interface and control on/off of the indication light, wherein the components are fixed on the upper surface of the circuit board body and located in the open window region of the adhesive layer; and
an uplink interface, located on the circuit board body and arranged to perform information interaction with the components; wherein, the components are connected to the electronic tag read/write interface, the indication light and the uplink interface,
wherein the apparatus further comprises:
a fusing and wiring panel housing, fixed under the flexible printed circuit board and comprising an optical fiber adapter for connecting optical fiber; and
a fusing and wiring panel upper cover covering the flexible printed circuit board, wherein a lower surface of the fusing and wiring panel upper cover is connected to the adhesive layer of the flexible printed circuit board, so as to package the components of the flexible printed circuit board within a space enclosed by the fusing and wiring panel upper cover, the adhesive layer and the circuit board body of the flexible printed circuit board.

11. The optical fiber network distribution apparatus according to claim 10, wherein the optical fiber adapter has a deflection angle of 45° to 90° with respect to a front mounting plate of the fusing and wiring panel housing.

12. The optical fiber network distribution apparatus according to claim 10, wherein the protruding interface has a deflection angle of 45° to 90° with respect to the circuit board body.

13. The optical fiber network distribution apparatus according to claim 10, wherein the electronic tag read/write interface is a contact interface or a contactless interface.

14. The optical fiber network distribution apparatus according to claim 13, wherein the contact interface is a contact point or a connector.

15. The optical fiber network distribution apparatus according to claim 13, wherein the contactless interface is a Radio Frequency Identification (RFID) antenna.

16. The optical fiber network distribution apparatus according to claim 10, wherein the circuit board body is made of a material of polyimide, polyester film or polytetrafluoroethylene.

17. The optical fiber network distribution apparatus according to claim 10, wherein the circuit board body have a rectangular shape.

18. The optical fiber network distribution apparatus according to claim 10, wherein the uplink interface is a Flexible Printed Circuit (FPC) interface, a Registered Jack 45 (RJ45) interface, an Universal Serial Bus (USB) interface, a DB9 interface or a radio-frequency antenna interface.

* * * * *